United States Patent [19]

Fukasawa et al.

[11] Patent Number: 4,842,706
[45] Date of Patent: Jun. 27, 1989

[54] SPUTTERING TARGET

[75] Inventors: Yoshiharu Fukasawa; Mituo Kawai; Hideo Ishihara; Takashi Yamanobe, all of Yokohama, Japan

[73] Assignee: Kabushiki Kaisha Toshiba, Kawasaki, Japan

[21] Appl. No.: 162,898

[22] Filed: Mar. 2, 1988

[30] Foreign Application Priority Data

Mar. 6, 1987 [JP] Japan ................................. 62-49940

[51] Int. Cl.⁴ ............................................. C23C 14/34
[52] U.S. Cl. ............................ 204/298; 204/192.15; 204/192.17
[58] Field of Search .............. 204/298, 192.15, 291.17, 204/298 TC

[56] References Cited

U.S. PATENT DOCUMENTS 4,468,313  8/1984  Okumura et al. ................... 204/298

FOREIGN PATENT DOCUMENTS 0124075   11/1984  European Pat. Off. ............ 204/298
59-179783 10/1984  Japan ................................. 204/298
59-208073 11/1984  Japan ................................. 204/298
61-116835  6/1985  Japan ................................. 204/298
60-202925 10/1985  Japan ................................. 204/298

OTHER PUBLICATIONS

N. Q. Lam, Journal of Vacuum Science & Technology A, "Elevated-Temperature Sputtering . . . ," vol. 3, No. 6, Second Series, Nov.–Dec. 1985, pp. 2152–2160.
Y. Nozawa, Patent Abstracts of Japan, vol. 10, No. 302 (E–445) [2358], Oct. 15, 1986.
R. Shibata, Patent Abstracts of Japan, vol. 10, No. 335 (C–384) [2391], Nov. 13, 1986.
N. Kuramoto, Patent Abstracts of Japan, vol. 10, No. 49 (C–330) [2106], Feb. 26, 1986.
M. Inoue, Patent Abstracts of Japan, vol. 10, No. 275 (E–438) [2331], Sep. 18, 1986.

Primary Examiner—Aaron Weisstuch
Attorney, Agent, or Firm—Foley & Lardner, Schwartz, Jeffery, Schwaab, Mack, Blumenthal & Evans

[57] ABSTRACT

Disclosed is a sputtering target which comprises a single block composed of one or more of metals prepared by a melting process or an alloy thereof; a combined block of the plural single blocks; or a combined block of the single blocks and silicon blocks; an average size of the crystal grains of the metal or the alloy being between 1 μm and 1 mm.

3 Claims, 1 Drawing Sheet

SPUTTERING TARGET

BACKGROUND OF THE INVENTION

This invention relates to a sputtering target for use in formation of conductive thin films on semiconductor elements such as LSI chips and the like, and more particularly it relates to a sputtering target by which thickness of the thin films can be made uniform and by which scatter of sheet resistance in the thin films can be minimized.

For example, in manufacturing MOS type LSI gate electrodes, conductive thin films of a high-melting metal or the like are formed on the surfaces of LSI chips. As a means for forming the thin films, a sputtering process is usually applied.

In this case, a suitable sputtering target is selected from those having various morphologies in compliance with the kind of thin films to be formed.

For example, when the thin film is formed of a single metal prepared by a melting process, there is used, as the sputtering target, a single block comprising a metal prepared by a melting process and having an optional shape, such as a disk plate, a rectangular plate or the like on the whole, or a combined block having an optional shape, such as a disk plate, a rectangular plate or the like on the whole and comprising a combination of a plurality of wedge-shaped units composed of the above-mentioned metal.

Further, when thin films are formed with an alloy such as a silicide, there is used, as the sputtering target, an alloy block comprising an alloy prepared by a melting process and having an optional shape, such as a disk plate, a rectangular plate or the like on the whole, or a combined block having an optional shape, such as a disk plate, a rectanguar plate or the like on the whole and comprising an optional combination of a plurality of wedge-shaped or square, bar-shaped single blocks composed of metals constituting the alloy prepared by the melting process.

Important requirements regarding a sputtering process are that film resistance (sheet resistance, $\Omega/\square$) of the formed thin film must not exceed a standard level and that scatter of sheet resistance values at certain positions on the surface of the formed thin film be narrow. The sheet resistance may be measured in accordance with a four-probe method.

SUMMARY OF THE INVENTION

It is an object of this invention to provide a sputtering target by which its sheet resistance can be easily controlled below a standard level and by which thin films can be formed in which scatter of sheet resistance values measured at different positions on the surfaces thereof is narrow.

In accordance with the present invention it has been determined that sheet resistance values of a formed thin film vary with thickness of the film. Therefore, in the case where the thickness of the thin film is different at various positions, the sheet resistance of the thin film is scattered i.e., variable.

It has been determined that when size and crystalline orientation of crystal grains of a metal or an alloy constituting the target are different, the amount sputtered therefrom is also different; in other words, the thickness of the thin film formed on an element disposed above the target is affected by size and the crystalline orientation of the crystal grains of the metal or the alloy constituting the target. However, when the metal or the alloy constituting the target is a single crystal, the crystalline orientation of the target is constant, and therefore the thickness of the formed thin film is not effected.

In consequence, if the target is a disk-like or rectangular, plate-like, single block or alloy block prepared by a melting process, and if crystal grains of the metal or the alloy constituting the block are different in size at certain positions in the block, sputtering amounts generated from those positions are not uniform and the thickness of the formed thin film will also be different at certain positions thereof. Moreover, in the case that the target is a combined block, the thickness of the formed thin film would differ at certain positions thereof owing to the influence of the scatter of the amount of sputtering due to the different size of the crystal grains in each wedge-like or rod-like block, and would also be different due to the differing amounts of sputtering from the various blocks.

To develop the present invention, the relations between the size of the crystal grains constituting the target and the scatter of the sheet resistance values was intensively investigated and it was found that the smaller the size of the crystal grains, the narrower the scatter of the sheet resistance values, and that a target composed of a metal or an alloy in which the average size of the crystal grains is 1 mm or less and more than 1 $\mu$m, i.e., between 1 $\mu$m and 1 mm, is extremely useful.

Thus, the sputtering target of this invention is characterized by comprising a single block composed of one or more of metals, or alloys thereof prepared by a melting process; a combined block comprising a plurality of single blocks; or a combined block comprising single blocks and silicon blocks; and further comprising an average size of crystal grains of the metal or the alloy of between 1 $\mu$m and 1 mm.

DESCRIPTION OF THE PREFERRED EMBODIMENTS

Figure 1:
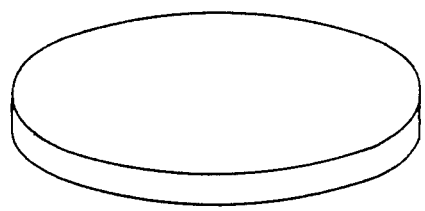
FIGS. 1 to 3 are perspective views illustrating the various shapes of sputtering targets of this invention.

Examples of the metals constituting the sputtering target of this invention include Mo, W, Ta, Nb, Ti, Ni, V, Cr and Al, and examples of the alloys include various combinations of these metals.

The above-mentioned metal or alloy is prepared by the hereinafter described procedure so that the average size of its crystal grains may be between 1 $\mu$m and 1 mm. When the average size of the crystal grains is more than 1 mm, sputtering amounts from the target become non-uniform at some positions on the formed thin film, with the result that the sheet resistance of the thin film is greatly scattered. On the other hand, when the average size of the crystal grains is less than 1 $\mu$m, the crystal grains themselves are sputtered, so that the scatter of the sheet resistance of the formed thin film is similarly worsened. Preferably, the average size of the crystal grains is 0.5 mm or less, particularly 0.1 mm or less.

This average grain size can be determined by first counting the number of crystal grains in the visual field of a microscope, then calculating an average area of one crystal grain, and determining the average diameter of the one crystal grain. The number (NA) of the crystal grains per unit area can be measured in the following manner:

In a microphotograph showing metallic structure, the number (NW) of the crystal grains completely contained in a circle having an area A and the number (Ni) of the crystal grains partially contained therein are first counted. In this case, it is suitable that a sufficient number of the crystal grains (e.g., 30 grains or more) is present in the circle. Then, the total number (NT) of the crystal grains can be given by the following formula:

$$NT = NW + \tfrac{1}{2}Ni$$

The formula of NA=NT/A can be derived and the average area per crystal grain can be clculated by A/NA. A diameter corresponding to this average area is the desired average grain diameter.

The target of this invention can be manufactured as follows:

A selected metal or alloy is melted in accordance with a vacuum melting process such as an EB (electron beam) melting process or an arc melting process. Then, the resulting melt is cooled to form an ingot having a predetermined shape, and the ingot is subjected to forging and rolling. Afterward, it is further molded into a single block having a predetermined shape such as a disk, a rectangular plate, a wedge or a square bar.

The size of the crystal grains of the metal or the alloy constituting the target can be adjusted by suitably selecting a working ratio in the steps of the forging and rolling. For example, in the case of an Mo target, a working ratio of 50% or more in the steps from the ingot to the single block can suitably provide the desirable grain diameter.

The crystal grains in the single block are stretched in a longitudinal direction of the ingot by the forging and rolling, so that the grains take on a fibrous structure. However, during the steps of forming and rolling, strain is accumulated in the ingot, and recrystallized grains are formed by a subsequent heat treatment at a recrystallization temperature or higher, with this strain functioning as a nucleus. Consequently, the recrystallized grains are present as fine crystal grains in the ingot.

Thereafter, the worked single block is subjected to a heat treatment at its recrystallization temperature or higher in order to obtain the desired target of the single block.

Figure 2:
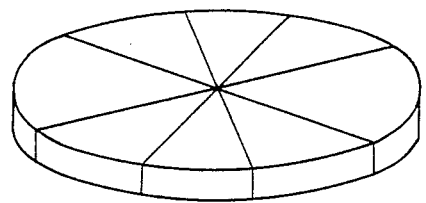
Figure 3:
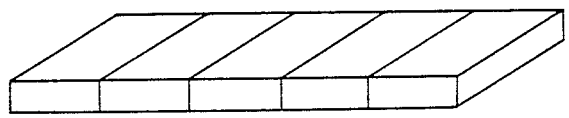

The thus manufactured rectangular plate-like, single block or disk-like, single block as shown in FIG. 1 may be directly mounted in a sputtering apparatus. In the case of the wedge-like or square bar-like single blocks, they may be combined suitably so as to prepare such a disk-like combined block configuration as shown in FIG. 2 or such a square rod-like combined block as shown in FIG. 3. Then, the combined block can be similarly mounted in the sputtering apparatus.

EXAMPLES 1 TO 2 AND COMPARATIVE EXAMPLES 1 TO 2

An Mo sintered body was melted by an EB melting process, and the resulting melt was worked to prepare 4 pieces of Mo ingots. Then, the respective ingots were subjected to forging and rolling in different working ratios, and a recrystallization heat treatment was then carried out to prepare disk-like targets having crystal grains of different average size. Working ratios wre about 90% in Example 1, about 70% in Example 2, about 45% in Comparative Example 1 and about 30% in Comparative Example 2.

These targets were used, and Mo thin films having a thickness of 3,000 Å were formed on Si wafers having a diameter of 5 inches, thereby preparing 350 sheets of LSI chips. For all of the thus formed thin films, sheet resistance was measured, and its average value was determined. In addition, a yield of the LSI chips was calculated.

Further, from a maximum value, a minimum value and the average value of the sheet resistance, scatter of the sheet resistance in each thin film was calculated by using the following formula:

$$\frac{\text{maximum value} - \text{minimum value}}{\text{average value}} \times 100 \; (\%)$$

These results are set forth in table 1.

EXAMPLE 3 AND COMPARATIVE EXAMPLE 3

A combined block type sputtering target was prepared in which Mo single blocks and Si single blocks comprising single crystals were alternately combined as shown in FIG. 2. The Mo single block was prepared by first molding an Mo power under a predetermined pressure; sintering the resulting molded body in a hydrogen atmosphere to form a sintered body, i.e., element; melting this element with electron beams to obtain an ingot; and plastically deforming and annealing it. The plastic deformation was carried out by extrusion, forging and rolling, under hot conditions (from 1,100° to 1,200° C.), with working ratios of about 25% in Example 3 and about 35% in Comparative Example 3. The thus obtained Mo material was machined to form wedge-like single blocks, and these wedge-like single blocks were then combined with similar wedge-like, single crystal Si blocks to prepare a sputtering target. The same sputtering procedure as in the former Examples was repeated with the exception that the thus prepared combined target was used. The results are set forth in table 1.

TABLE 1

| | Working ratio (%) | Average size of crystal grains (mm) | Sheet resistance (Ω/□) Average (Ω/□) | Sheet resistance (Ω/□) Scatter (%) | Yield of LSI chips (%) |
|---|---|---|---|---|---|
| Example 1 | about 90 | 0.08 | 2.7 | 8.5 | 98 |
| Example 2 | about 70 | 0.5 | 2.8 | 16 | 92 |
| Example 3 | about 75 | 0.3 | 4.3 | 11 | 92 |
| Comparative Example 1 | about 45 | 2 | 3.7 | 20.8 | 87 |
| Comparative Example 2 | about 30 | 15 | 5.0 | 32 | 84 |
| Comparative Example 3 | about 35 | 7 | 7.2 | 33 | 85 |

EXAMPLE 4 AND COMPARATIVE EXAMPLE 4

The same sputtering procedure as in Example 2 was repeated with the exception that a sputtering target as shown in FIG. 1 was used which had been prepared by melting a Ta material by electron beam melting, plastically deforming, and machining. The results are set forth in table 2.

TABLE 2

| | Average size of crystal grains (mm) | Specific resistance (μΩcm) | Scatter of sheet resistance (%) |
|---|---|---|---|
| Example 4 | 0.8 | 200 | 1.3 |
| Comparative | 15 | 180 | 4.5 |

TABLE 2-continued

|  | Average size of crystal grains (mm) | Specific resistance (μΩcm) | Scatter of sheet resistance (%) |
|---|---|---|---|
| Example 4 | | | |

As is apparent from the above description, the sputtering target of this invention can decrease scatter of sheet resistance of formed thin films, so that LSI chips can be manufactured with a high yield. Therefore, the sputtering target of this invention has great industrial value.

What is claimed is:

1. A sputtering target comprising a plurality of single blocks combined together to form a combined block, said combined block including single blocks of metal prepared by a melting process and single blocks of silicon, said single blocks of metal having crystal grains with an average size between 1 μm and 1 mm.

2. A sputtering target according to claim 1 wherein said silicon is a single crystal.

3. A sputtering target according to claim 1 wherein said metal is Mo.

* * * * *